(12) United States Patent
Czubatyj et al.

(10) Patent No.: US 8,796,101 B2
(45) Date of Patent: *Aug. 5, 2014

(54) MEMORY DEVICE

(75) Inventors: Wolodymyr Czubatyj, Warren, MI (US); Regino Sandoval, Caldwell, ID (US)

(73) Assignee: Ovonyx, Inc., Sterling Heights, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/590,085

(22) Filed: Aug. 20, 2012

(65) Prior Publication Data

US 2012/0329237 A1    Dec. 27, 2012

Related U.S. Application Data

(63) Continuation of application No. 12/044,407, filed on Mar. 7, 2008, now Pat. No. 8,269,208.

(51) Int. Cl.
*H01L 21/8239* (2006.01)

(52) U.S. Cl.
USPC ......... 438/382; 257/4; 257/2; 257/3; 438/102

(58) Field of Classification Search
USPC ........................................ 438/102, 382; 257/4
See application file for complete search history.

(56) References Cited

U.S. PATENT DOCUMENTS

| | | | |
|---|---|---|---|
| 6,617,192 B1 * | 9/2003 | Lowrey et al. | 438/95 |
| 7,463,512 B2 * | 12/2008 | Lung | 365/163 |
| 8,269,208 B2 * | 9/2012 | Czubatyj et al. | 257/4 |
| 2004/0251551 A1 * | 12/2004 | Hideki | 257/758 |
| 2006/0125108 A1 * | 6/2006 | Gutsche et al. | 257/774 |
| 2008/0185570 A1 * | 8/2008 | Wu et al. | 257/3 |

* cited by examiner

*Primary Examiner* — Robert Carpenter
(74) *Attorney, Agent, or Firm* — Kevin L. Bray

(57) ABSTRACT

A phase-change memory device includes a first insulator having a hole therethrough, a first electrode that conforms at least partially to the hole, a phase-change material in electrical communication with the first electrode, and a second electrode in electrical communication with the phase-change material. When current is passed from the first electrode to the second electrode through the phase-change material, at least one of the first and second electrodes remains unreactive with the phase change material.

11 Claims, 6 Drawing Sheets

MEMORY DEVICE

RELATED APPLICATION INFORMATION

This application is a continuation of U.S. patent application Ser. No. 12/044,407, filed Mar. 7, 2008, now U.S. Pat. No. 8,269,208 the disclosure of which is hereby incorporated by reference herein.

TECHNICAL FIELD

The embodiments described herein are generally directed to memory devices including a phase-change material.

BACKGROUND

Non-volatile memory devices are beneficial in certain applications where data must be retained when power is disconnected. Applications include general memory cards, consumer electronics (e.g., digital camera memory), automotive (e.g., electronic odometers), and industrial applications (e.g., electronic valve parameter storage). The non-volatile memories may use phase-change memory materials, i.e., materials that can be switched between a generally amorphous and a generally crystalline state, for electronic memory applications. The memory of such devices typically comprises an array of memory elements, each element defining a discrete memory location and having a volume of phase-change memory material associated with it. The structure of each memory element typically comprises a phase-change material, one or more electrodes, and one or more insulators.

One type of memory element originally developed by Energy Conversion Devices, Inc. utilizes a phase-change material that can be, in one application, switched between a structural state of generally amorphous and generally crystalline local order or between different detectable states of local order across the entire spectrum between completely amorphous and completely crystalline states. These different structural states have different values of resistivity, and therefore each state can be determined by electrical sensing. Typical phase-change materials suitable for memory application include those incorporating one or more chalcogen or pnictogen elements. Unlike certain known devices, these electrical memory devices typically do not use field-effect transistor devices as the memory storage element. Rather, they comprise, in the electrical context, a monolithic body of thin film chalcogenide material. As a result, very little area is required to store a bit of information, thereby providing for inherently high-density memory chips.

Ovonic unified or phase-change memories are an emerging type of electrically-alterable non-volatile semiconductor memories. These memories exploit the properties of materials (phase-change materials) that can be reversibly switched between two or more structural states that vary in the relative proportions of amorphous and crystalline phase regions when subjected to heat or other forms of energy. The term "amorphous" refers to a condition which is relatively structurally less ordered or more disordered than a single crystal and has a detectable characteristic, such as high electrical resistivity. The term "crystalline" as used herein refers to a condition which is relatively structurally more ordered than amorphous and has at least one detectably different characteristic, such as a lower electrical resistivity.

The distinct structural states of a phase-change material exhibit different electrical characteristics, such as resistivity, that can be used to distinguish the different states. Memory or logic functionality is achieved by associating a different memory or logic value with each structural state. Programming occurs by providing the energy needed to stabilize the structural state of the phase-change material associated with the input memory or logic data.

Typically, a memory array includes a matrix of phase-change memory cells, arranged in rows and columns with associated word lines and bit lines, respectively. Each memory cell typically consists of a phase-change storage element connected in series to an access element, where each memory cell is connected between a particular word line and a particular bit line of the array. Each memory cell can be programmed to a particular memory state by selecting the word line and bit line associated with the memory cell and providing a suitable energy pulse across the memory cell. The energy pulse is typically a current pulse applied to the memory cell by supplying a voltage potential between the word line and bit line of the cell. The voltage potential activates the access element connected to the memory element, thereby enabling the flow of current through the memory element. Typical access elements include diodes and transistors. Reading of the memory state is accomplished by similarly selecting the word line and bit line of the memory cell and measuring the resistance (or a proxy therefore such as the voltage drop across the cell). In order to maintain the state of the memory cell during read, it is necessary to maintain the energy of the read signal at a level below that needed to transform the memory cell from its existing state to a different state.

Current embodiments of phase-change memory devices include a phase-change material in electrical communication with two or more metal contacts. An undesirable characteristic of many metal contacts is their tendency to react with or form alloys with the phase-change material. Alloying may occur at the interface between phase-change material and metal contact and may be facilitated by diffusion or electromigration of metal atoms during operation of the device. When reaction or alloying occurs, the memory device characteristics deteriorate. As a result, the operating life and performance of the device are compromised.

Therefore, a need has arisen to improve and maintain device performance over time. Moreover, it is desirable to reduce or substantially prevent reaction or alloying of metal contacts with the phase-change material of the memory device. It is also desirable to provide a contact having a high temperature resistance and high material stability.

SUMMARY

A memory device includes a first insulator having a hole therethrough and a first electrode. The first electrode conforms at least partially to the hole. The first electrode also includes a bottom portion and a vertical portion. In one embodiment, the first electrode is a circumferential electrode. The first electrode may comprise carbon. The memory device further includes a second electrode and a phase-change material disposed between the first electrode and the second electrode.

An alternative memory device includes a first interconnect and a first insulator disposed over the first interconnect. The first insulator includes a hole therethrough. A first electrode conforms to the inner periphery of the hole and is in electrical communication with the first interconnect. In one embodiment, the first electrode is a concentric electrode including two or more layers, at least one of which comprises carbon. The memory device also includes a second electrode and a phase-change material disposed between the first electrode and the second electrode. The phase-change material is in direct contact with at least a portion of the first electrode. Also, the first electrode comprises a material compatible with the phase-change layer to reduce migration.

Also described is a method of making a memory device. The method includes providing a first insulator and configuring a hole through the first insulator. A first conductive layer is provided that conforms to the inner periphery of the hole. The first conductive layer may include at least one of carbon, carbon nitride, titanium nitride, and carbon nanotubes. A portion of the first conductive layer is configured and leaves a first electrode. A phase-change material is provided over the first insulator and is in electrical communication with the first electrode. A second insulator is provided over the phase-change material. The second insulator is configured to expose a portion of the phase-change material. A second conductive layer is provided to electrically communicate with the phase-change layer.

BRIEF DESCRIPTION OF THE DRAWINGS

The features and inventive aspects will become more apparent upon reading the following detailed description, claims, and drawings, of which the following is a brief description:

DETAILED DESCRIPTION

Figure 1:
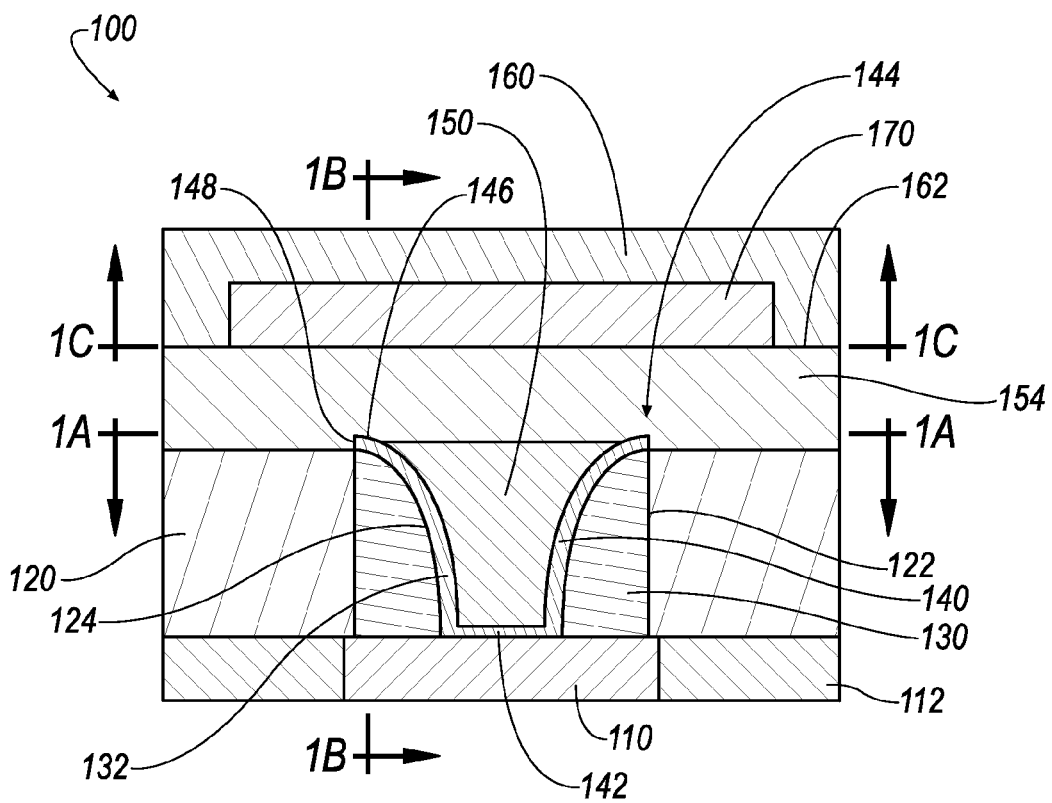
FIG. 1 is a cross-sectional view of a phase-change memory device.

Referring now to the drawings, illustrative embodiments are shown in detail. Although the drawings represent the embodiments, the drawings are not necessarily to scale and certain features may be exaggerated to better illustrate and explain novel aspects of an embodiment. Further, the embodiments described herein are not intended to be exhaustive or otherwise limit or restrict the claims to the precise form and configuration shown in the drawings and disclosed in the following detailed description.

A memory device is provided that includes a first electrode, a second electrode, and a phase-change material therebetween. The first electrode includes a material that is not prone to reacting or alloying with the phase-change material. The instant electrode material may inhibit reaction or alloying by reducing atomic migration between the phase-change material and the electrode material. Elements within the electrode material may also be selected on the basis of thermodynamic unfavorability in the formation of a compound with the phase-change material. By reducing chemical interactions between the electrode material and phase-change material, the stability of both materials is preserved and the operational characteristics of the memory device are more consistent from cycle-to-cycle during operation and the operational lifetime of the device is extended.

In a representative device according to the instant invention, a minimum-lithographically-sized hole is made in an insulator material formed over a substrate or interconnect and a first electrode is formed therein. The hole may also be configured with a insulative spacer to further reduce the size of the hole to a sub-lithographic dimension. The first electrode may then be formed within the hole. Preferably, the first electrode is formed via a conformal or nearly conformal deposition technique. A phase-change material is formed over the first electrode and a second electrode is formed over the phase-change material. Representative examples of device structures are described in greater detail hereinbelow. In the devices of this invention, at least one telectrode material comprises a material that inhibits or prevents reactions, alloying, atomic migration or other chemical or physical interactions with the phase-change material. The electrode material may include carbon, carbon nitride, carbon nanotubes, etc. The first electrode properties may include a contact having a high temperature resistance and high material stability.

In one embodiment, the first contact includes an annular contact region with the phase-change material to reduce the area of contact between the electrode and phase-change material. The resulting memory device has a low programming current due to a reduced programming volume along with a long cycle life and stable operating characteristics due to minimal alloying or reaction between the electrode material and phase-change material. In an alternative embodiment, a carbon-comprising plug may be placed inside the inner periphery of a concentric surrounding electrode. In this case, the surrounding electrode may comprise a metal (e.g. Ti, TiN, TiAlN, MoN, W). The inner plug may include carbon, carbon nitride, carbon nanotubes, or other forms of carbon.

Embodiments of a memory device, including a phase-change memory material, are described in detail herein. The memory device may be written to and read in a manner such as those described in U.S. Pat. No. 6,687,153, issued Feb. 3, 2004, to Lowrey, for "Programming a Phase-Change Material Memory", and U.S. Pat. No. 6,487,113 to Park and Lowrey for "Programming a Phase-Change memory with Slow Quench Time", the disclosures of which are hereby incorporated by reference in their entirety, as well as other methods known to those skilled in the art. The memory device may also be configured as an array of devices such that a high-density memory array is created.

In yet another aspect, the memory device may be configured to provide multi-level storage. That is to say, the memory device may have a plurality of discrete and identifiable states allowing for multi-bit storage in a single memory element, rather than a common binary storage element. The phase-change memory material may be configured, along with adjacent structures, to facilitate multi-level storage in an improved manner. For a general discussion of multistate and direct overwrite storage see, for example, U.S. Pat. No. 7,227,170 to Ovshinsky for "Multiple Bit Chalcogenide Storage Device", the disclosure of which is hereby incorporated by reference in its entirety.

As discussed herein, the term "electrical communication" is intended to mean that two or more structures allow electrical current to flow from one structure to another. In one example, electrical communication may arise from direct contact of one material to another. In another example, electrical communication may include an intermediate structure such as a carbon layer, a phase-change material, a metal structure and/or other conductive layer that facilitates electrical current flow between structures. Such a structure, in the example of a carbon layer, may be desirable when the carbon layer is used as an etch-stop in a fabrication process or to modify the resistivity of a contact. Thus, the term electrical communication is not limited merely to two physically contacting structures.

FIG. 1 is a cross-sectional view of a phase-change memory device 100. Memory device 100 includes a first interconnect 110 that electrically connects memory device 100 with external circuitry (not shown) for the reading and writing operations of memory device 100. A first insulator 120 provides thermal and electrical isolation for a phase-change layer 154.

First interconnect 110 is typically made of a conductive material, such as a metal, metal alloy, or metal-containing compound (e.g. Ti, TiAlN, TiSiN, TiN, MoN) or carbon and may be a homogeneous, layered, or composite material. Interconnect insulator 112 and first insulator 120 may be made of SiO2 (silicon dioxide), SiNx (silicon nitride), other oxide or nitride, or other insulators. Interconnect insulator 112 separates and isolates memory device 100 and first interconnect 110 from surrounding structures and circuits. A first electrode 140 is in electrical communication with phase-change layer 154 and first interconnect 110. On the side of phase-change layer 154 opposite first electrode 140, a second electrode 160 is in electrical communication with phase-change layer 154. A first contact region 144 is at the interface of first electrode 140 and phase-change layer 154. A second contact region 162 is at the interface of second electrode 160 and phase-change layer 154. The region of phase-change material between first contact region 144 and second contact region 162 is the active area (described below in detail with respect to FIG. 3) of memory device 100.

A lower isolation layer (not shown) is below first interconnect 110 and a capping insulator (not shown) above second electrode 160 may be made of a dielectric, for example, silicon dioxide (SiO2) (present as a native or grown oxide on an underlying silicon-based substrate or formed from TEOS (tetraethoxysilane)), other oxide, Si3N4, or other nitride. The dielectric may be deposited by techniques such as chemical vapor deposition (CVD), metal-organic chemical vapor deposition (MOCVD), sputtering, physical vapor deposition (PVD), atomic layer deposition, selective deposition, evaporation, or other deposition methods generally known in the art. The lower isolation layer is typically supported by an underlying substrate or wafer that may include peripheral circuitry such as transistors, diodes, power supplies etc. In general, the lower isolation layer and capping insulator are optional, but may be provided to electrically and thermally insulate memory device 100 from other circuitry that may be constructed above or below memory device 100.

First insulator 120 includes a hole 122 that is typically formed at the smallest lithographic dimension available. Hole 122 is formed through the entire layer of insulator material to expose first interconnect 110. Hole 122 may be formed, in an example, using reactive ion etching (RIE) or a chemical etch with appropriate masking techniques known in the art.

A spacer 130 may optionally be formed within hole 122 to achieve sublithographic hole 124. The material for spacer 130 may be deposited as a layer over first insulator 120 and hole 132 and subsequently etched to provide spacer 130. Spacer 130 is an insulating material, typically an oxide or nitride such as silicon dioxide ($SiO_2$) or silicon nitride ($Si_3N_4$ or $SiN_x$) or other nitride. The material removed to form spacer 130 defines the boundaries of sublithographic hole 124.

First electrode 140 is conformally deposited over spacer 130 and first insulator 120. First electrode 140 may comprise, for example, carbon, carbon nitride, carbon nanotubes, or other forms of carbon. Typically a plasma-enhanced chemical vapor deposition (PECVD) process is used to deposit carbon. However, other methods may also be used including chemical vapor deposition (CVD), metal-organic chemical vapor deposition (MOCVD), sputtering, physical vapor deposition (PVD), atomic layer deposition, or other deposition methods generally known in the art.

First electrode 140 includes a bottom portion 142 that is in electrical communication with first interconnect 110. A vertical portion 132 conforms to the inner wall of sublithographic hole 124 and extends upwardly. Excess material from the conformal deposition of first electrode 140 is etched away up to the periphery of hole 122. The remaining structure includes an exposed end portion 148 and an exposed upper portion 146 that are a part of first contact region 144.

Figure 2:
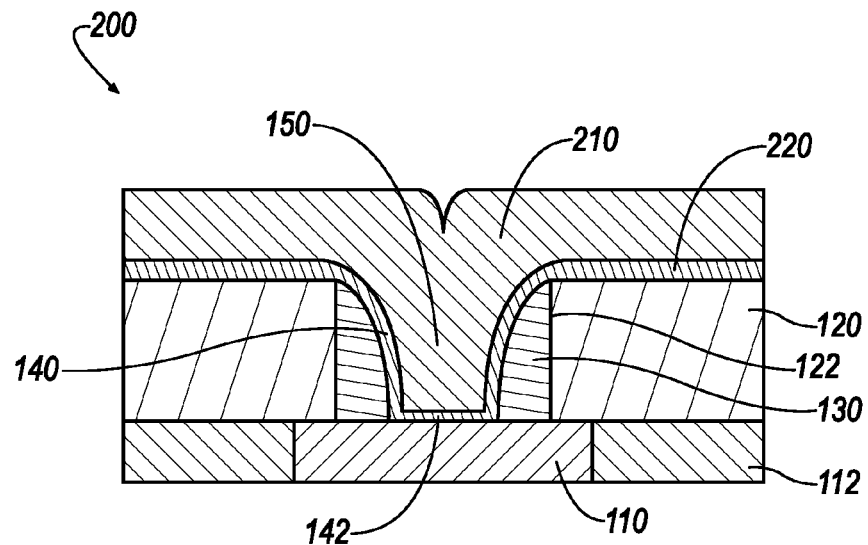
FIG. 2 is a cross-sectional view of the phase-change memory device of FIG. 1 at a partial stage of construction.

A layer of insulator, typically silicon dioxide ($SiO_2$), other oxide, silicon nitride ($Si_3N_4$ or $SiN_x$) or other nitride, is then deposited over first electrode 140 and first insulator 120 (see also FIG. 2). The insulator layer fills the center region of sublithographic hole 124 over first electrode 140 completely and excess material is removed, leaving a center insulator 150.

Figure 1A:
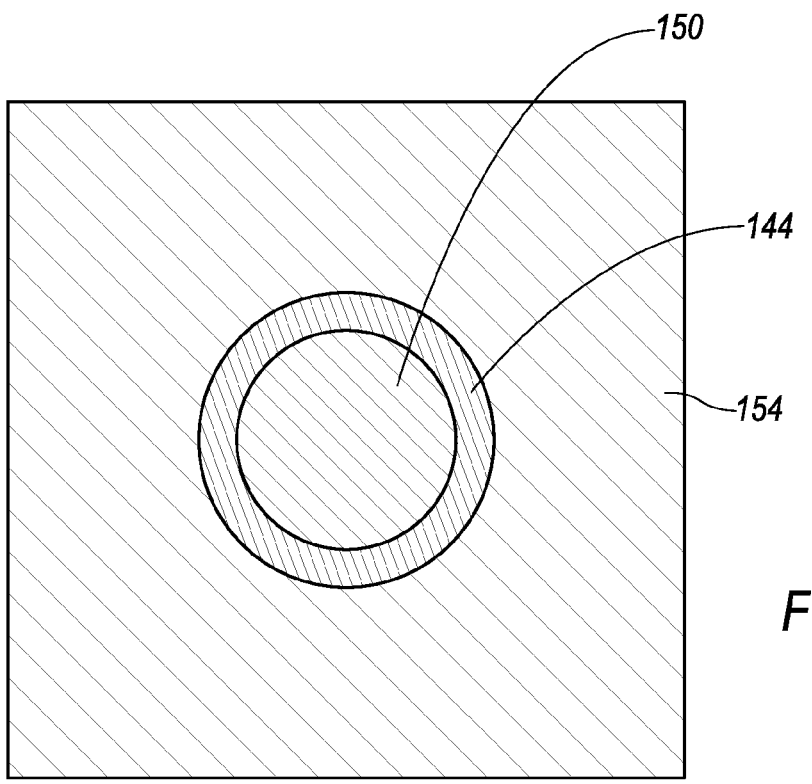
FIG. 1A is a cross-sectional view of a first contact region, a center insulator, and a phase-change layer taken from section lines 1A of FIG. 1.

Phase-change layer 154 is provided conformally over first insulator 120, first contact region 144, and center insulator 150. Phase-change layer 154 is in electrical communication with first electrode 140 at first contact region 144, which includes exposed end portion 148 and exposed upper portion 146. FIG. 1A is a cross-sectional view of first contact region 144, center insulator 150, and phase-change layer 154 taken from section lines 1A of FIG. 1. First contact region 144 is generally annular and surrounds center insulator 150. Phase-change layer 154 surrounds first contact region 144 and also covers first contact region 144 (shown in FIG. 1). In addition to a generally annular shape, first contact region 144 may be any circumferential shape. As used herein, a circumferential shape refers to a curved (e.g. circle, ellipse, arc), bent (e.g. square, rectangle, obtuse or acute angle), or linear shape.

Figure 1B:
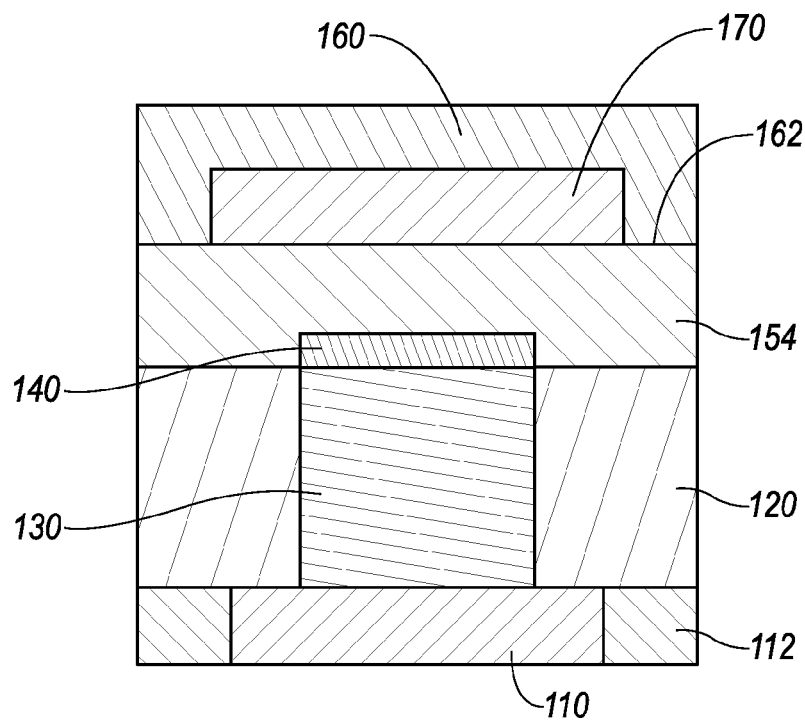
FIG. 1B is a cross-sectional view of the phase-change memory device taken from section lines 1B of FIG. 1.

FIG. 1B is a cross-sectional view of the phase-change memory device taken from section lines 1B of FIG. 1. In this offset cross-section, first electrode 140 is formed over spacer 130 and is in electrical communication with phase-change layer 154. Spacer 130 is formed over first interconnect 110 and provides a surface to allow first electrode 140 to connect first interconnect 110 and phase-change layer 154. Phase-change layer 154 is conformally deposited over first insulator 120 and first electrode 140.

Figure 1C:
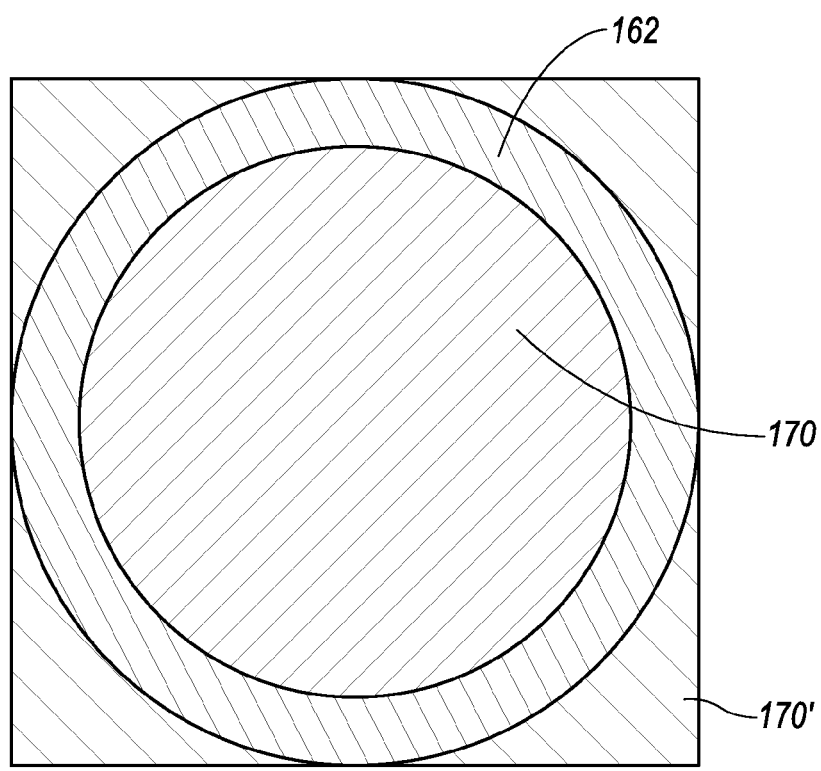
FIG. 1C is a cross-sectional view of a second contact region and a second insulator taken from section lines 1C of FIG. 1.

FIG. 1C is a cross-sectional view of second contact region 162 and a second insulator 170 taken from section lines 1C of FIG. 1. A layer of insulator, typically silicon dioxide ($SiO_2$), other oxide, silicon nitride ($Si_3N_4$ or $SiN_x$), or other nitride, is deposited over phase-change layer 154. The insulator layer is then patterned so that second insulator 170 is centrally located over hole 122 and first electrode 140. Second electrode 160 is deposited over second insulator 170. The excess regions of the second electrode layer are then removed, leaving second electrode 160 as an annular region in electrical communication with phase-change layer 154 at second contact region 162. In addition to a generally annular shape, second contact region 162 may be any circumferential shape. As used herein, a circumferential shape refers to a curved (e.g. circle, ellipse, arc), bent (e.g. square, rectangle, obtuse or acute angle), or linear shape.

Second insulator 170 is used to insulate the region of phase-change layer 154 directly above first electrode 140 and to provide a substrate for building second electrode 160 having an annular second contact region. Second insulator 170 also establishes a lateral offset between first contact region 144 and second contact region 162 that acts to bias current flow during device operation away from the center of hole 122. This effect inhibits the programming of phase-change layer 154 in the central portion of the device (e.g. in the portion of phase-change layer 154 above the interior portion of first contact region 144 shown in FIG. 1A) and promotes programming in the portions of phase-change layer 154 that overlie the exterior of first contact region 144. (See FIG. 3) Second contact region 162 is laterally displaced from first contact region 144, the inner periphery of hole 122, and central insulator 150. The displacement is in an outward direction, meaning in a direction away from the central axis of the device.

A capping insulator 170' is deposited over second electrode 160 and serves to insulate second electrode 160 from surrounding circuitry and also to insulate the upper region of phase-change layer 154. Capping insulator 170' is typically formed as a layer of insulator material that covers the completed device. Capping insulator 170' generally isolates memory device 100 and other interconnects and/or devices may be manufactured above memory device 100.

FIG. 2 is a cross-sectional view of phase-change memory device 100 at a partial stage of construction. Here, spacer 130 is fully configured within hole 122. Central insulator 150 is shown as a full insulator layer 210 before configuration. First electrode 140 is shown as a full conformal conductive layer 220 before configuration. As discussed in detail with respect to the process of FIG. 4, portions of insulator layer 210 and conductive layer 220 are removed to provide central insulator 150 and first electrode 140 (as shown in FIG. 1).

Figure 3:
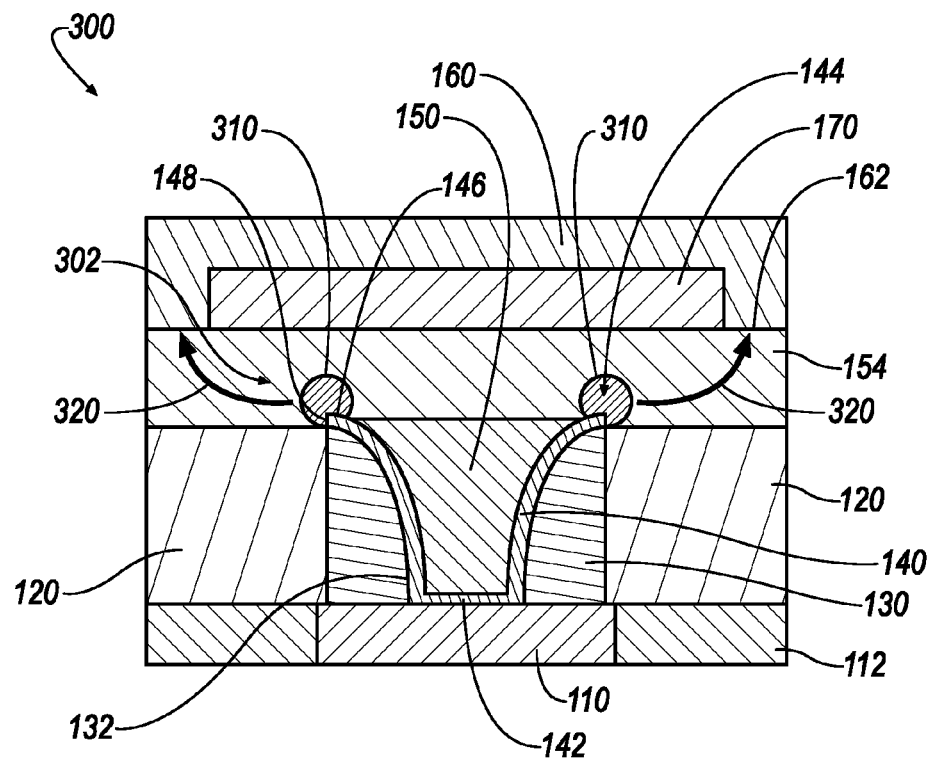
FIG. 3 is a cross-sectional view of the phase-change memory device of FIG. 1 that also shows phase-change function.

FIG. 3 is a cross-sectional view of a phase-change memory device 300 that also shows phase-change programming function. An active region 302 is between first contact region 144 and second contact region 162. When combined with support circuitry, first electrode 140 is provided with a current 320 (shown by the arrow) that flows through phase-change layer 154 to second electrode 160. When active region 302 of phase-change layer 154 is heated upon applying a current between first contact region 144 and second contact region 162, a phase-change programming region 310 forms between first and second electrodes 140, 160. In this example, phase-change programming region 310 is generally proximal to first contact region 144. Phase-change programming region 310 controls the data storage of the device by controlling the resistance of active region 302 between first contact region 144 and second contact region 162 (see FIG. 3). When programmed region 310 is heated and then cooled slowly, it is programmed to a relative crystalline, low resistance state (e.g. the set state). When programmed region 310 is heated and then cooled rapidly, it is programmed to a relatively amorphous high resistance state (e.g. the reset state). The device resistance is read between electrodes 140, 160 to determine the programmed memory state (set state, reset state or intermediate resistance state).

When current 320 is provided, an electrical circuit path is formed from first electrode 140 through phase-change layer 154 and to second electrode 160. Because electrodes 140, 160 are on opposite sides of phase-change layer 154, the current flow is necessarily through phase-change layer 154. As shown in FIGS. 1A and 1C, both first electrode 140 and second electrode 160 include generally annular or circumferential contact regions 144, 162, respectively. Second contact region 162 is larger in radius or cross-sectional dimension than first contact region 144. Thus, current 320 moves generally vertically and generally laterally through phase-change layer 154 at active region 302. Phase-change programming region 310 follows the direction of the flow of current 320 and is generally annular or circumferential, following the shape of first contact region 144.

Phase-change layer 154 is preferred to be a $Ge_2Sb_2Te_5$ chalcogenide alloy (hereinafter referred to as GST225). However, other phase-change materials may also be used. As used herein, the term phase-change memory material refers to a material capable of changing between two or more phases or structures that have distinct electrical characteristics. Phase-change layer 154 preferably includes at least one chalcogen element selected from Te and Se, and may further include one element selected from the group consisting of Ge, Sb, Bi, Pb, Sn, As, S, Si, P, O, N, In and mixtures thereof. Suitable chalcogenide switching materials include, but are not limited to, GaSb, InSb, InSe, $Sb_2Te_3$, GeTe, $Ge_2Sb_2Te_5$, ternary Ge—Sb—Te compositions, InSbTe, ternary In—Sb—Te compositions, ternary GaSeTe compositions, TAG and other ternary Te—As—Ge compositions, $SnSb_2Te_4$, InSbGe, ternary In—Sb—Ge compositions, AgInSbTe, quaternary Ag—In—Sb—Te compositions, (GeSn)SbTe, quaternary Ge—Sn—Sb—Te compositions, GeSb(SeTe), quaternary Ge—Sb—Se—Te compositions, $Te_{81}Ge_{15}Sb_2S_2$ and quaternary Te—Ge—Sb—S compositions.

Examples of chalcogenide materials are found in commonly assigned U.S. Pat. No. 5,166,758, U.S. Pat. No. 5,296,716, U.S. Pat. No. 5,534,711, U.S. Pat. No. 5,536,947, U.S. Pat. No. 5,543,737, U.S. Pat. No. 5,596,522, U.S. Pat. No. 5,687,112, U.S. Pat. No. 5,694,146, U.S. Pat. No. 5,757,446, and U.S. Pat. No. 6,967,344. The disclosures of U.S. Pat. Nos. 5,166,758, 5,296,716, 5,534,711, 5,536,947, 5,543,737, 5,596,522, 5,687,112, 5,694,146, 5,757,446, and 6,967,344 are incorporated by reference herein.

The resistivity of chalcogenides generally varies by two or more orders of magnitude when the chalcogenide material changes phase from an amorphous state (more resistive) to a polycrystalline state (less resistive). Electrodes 140, 160 deliver an electric current to the phase-change memory material. As the electric current passes from first electrode 140 to second electrode 160 through phase-change layer 154, at least a portion of the electric energy of the electron flow is transferred to the surrounding material as heat. That is, the electrical energy is converted to heat energy via Joule heating. The amount of electrical energy converted to heat energy increases with the resistivity of the electrical contact (and memory material) as well as with the current density (i.e., current divided by area), passing through the electrical contact and the memory material. Joule heating provides a source of energy that may be used to program the memory material to different memory states.

In the operation of memory device 100, first electrode 140 and second electrode 160 are connected to support circuitry (not shown) for programming (e.g., writing information) and reading memory device 100. The support circuitry may include the capability to program and read memory device 100 in binary mode, which provides two states, as well as a multi-level mode, which provides a variable number of states. The different states may be distinguished on the basis of electrical resistance, where electrical resistance is bounded by the resistance of the device in its set state on the low end and by the resistance of the device in its reset state on the high end. Multiple states having resistances between the set and reset states may also be programmed.

Figure 4:
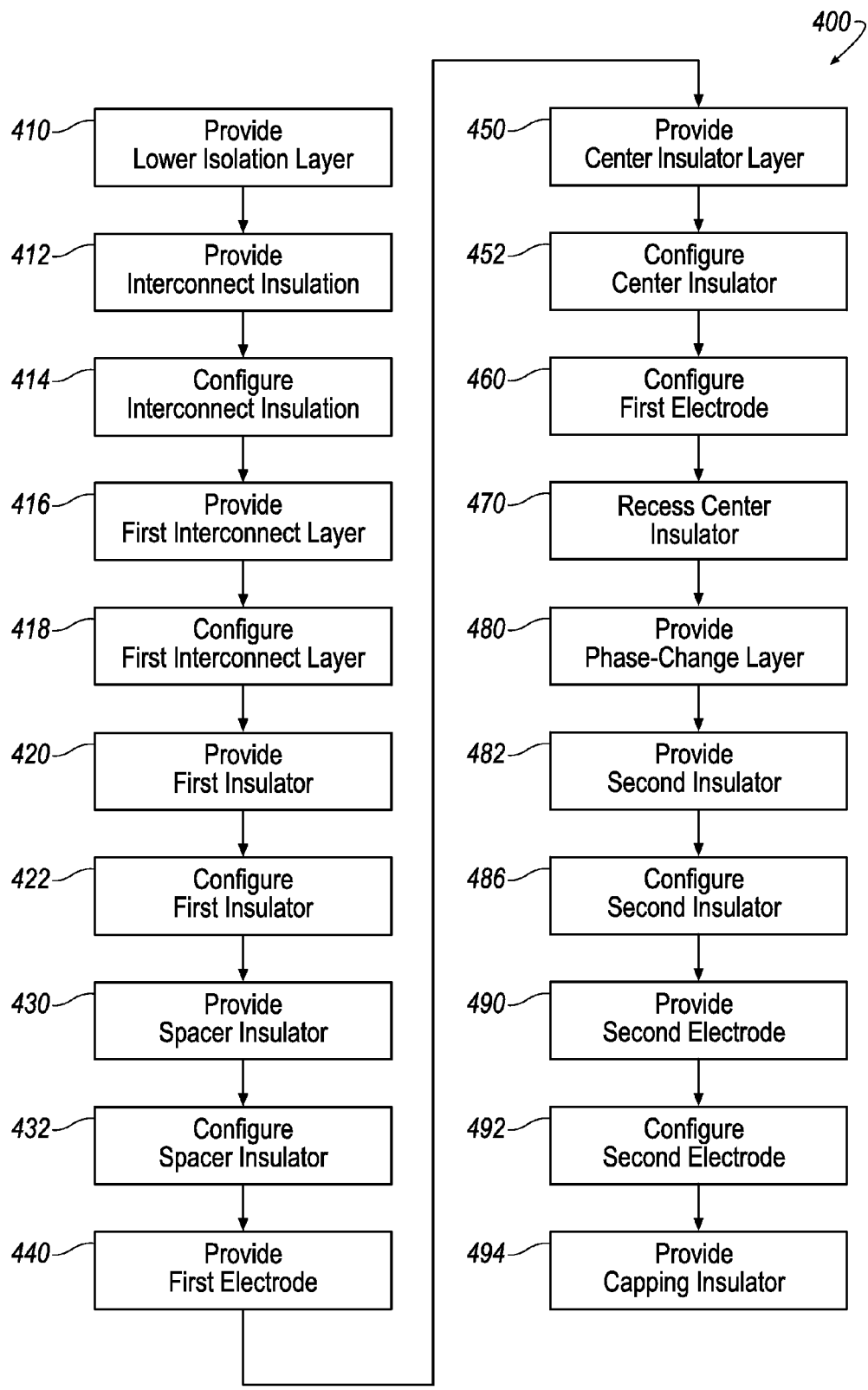
FIG. 4 is a flow diagram of the construction of the phase-change memory device of FIG. 1.

FIG. 4 is a flow diagram 400 of the construction of the phase-change memory device of FIGS. 1-3. In step 410, a lower isolation layer is provided. The lower isolation layer may be made of silicon dioxide ($SiO_2$), other oxide, silicon nitride ($Si_3N_4$ or $SiN_x$), other nitride, or other insulator, and may be deposited by techniques such as chemical vapor deposition (CVD), metal-organic chemical vapor deposition (MOCVD), sputtering, physical vapor deposition (PVD), atomic layer deposition, selective deposition or other deposition methods generally known in the art. The lower isolation layer generally provides electrical and thermal isolation from any structures that memory device 100 may be constructed on top of. Thermal isolation is provided so that device operating heat is not leaked to adjacent structures and remains concentrated on phase-change layer 154, thus minimizing the energy required during operation to create or maintain a particular level of heating within the phase-change layer. Further, the lower isolation layer may be provided on top of a wafer that includes semiconductor elements where memory device 100 is to be constructed above or within typical interconnect strata. That is to say, the lower isolation layer may be provided on top of a substrate that contains circuits and systems that are to be used in conjunction with memory device 100 or otherwise. Alternatively, the lower isolation layer may itself be a glass or silicon wafer of suitable properties for constructing memory device 100.

Next, in step 412, first interconnect insulator 112 is provided. First interconnect insulator 112 may comprise a material such as silicon dioxide ($SiO_2$), other oxide, silicon nitride ($Si_3N_4$ or $SiN_x$), other nitride or other insulator. Interconnect insulator 112 may be deposited by chemical vapor deposition (CVD), metal-organic chemical vapor deposition (MOCVD), sputtering, physical vapor deposition (PVD), atomic layer deposition, selective deposition or other deposition methods generally known in the art.

Next, in step 414, first interconnect insulator 112 is configured. First interconnect insulator 112 is provided as a layer in step 412 and is configured in step 414 by patterning (e.g., mask and etch) to form an opening for first interconnect 110.

Next, in step 416, first interconnect 110 is provided. First interconnect 110 is typically a conductive material, such as a metal, metal alloy, or metal-containing compound (e.g. W, Ti, TiAlN, TiSiN, TiN, MoN) or carbon and may be a homogeneous, layered, or composite material. First interconnect 110 may be deposited by chemical vapor deposition (CVD), metal-organic chemical vapor deposition (MOCVD), sputtering, physical vapor deposition (PVD), atomic layer deposition, selective deposition or other deposition methods generally known in the art. As memory device 100 may be constructed between steps in a semiconductor process, first interconnect 110 may be deposited along with other interconnect lines for other circuitry constructed on the substrate.

Next, in step 418, first interconnect 110 is configured. Excess material from the deposition of first interconnect 110 is removed. In particular, excess material that is above first interconnect insulator 112 is removed. In an example, the excess insulator material is removed using a chemical mechanical polishing (CMP) process.

Next, in step 420, first insulator 120 is provided. First insulator 120 may be a silicon dioxide ($SiO_2$), other oxide, silicon nitride ($Si_3N_4$ or $SiN_x$), other nitride or other insulator material and may be deposited by chemical vapor deposition (CVD), metal-organic chemical vapor deposition (MOCVD), sputtering, physical vapor deposition (PVD), atomic layer deposition, selective deposition or other deposition methods generally known in the art. For improved performance, first insulator 120 may be selected for reduced thermal conductivity to minimize heat losses away from phase-change layer 154 during programming operations. The alternative materials for first insulator 120 may include, but are not limited to, carbide materials, aerogel, xerogel and their derivatives.

Next, in step 422, first insulator 120 is configured to provide hole 122. In this step, hole 122 is etched through first insulator 120 to expose first interconnect 110 using, in an example, reactive ion etching (RIE) or a chemical etch with appropriate masking techniques. Because first insulator 120 was provided as a layer in step 420, it is necessary to remove some of the insulating material such that hole 122 is provided through the entire layer of first insulator 120.

Next, in step 430, an insulation layer is provided above first insulator 120 that will become spacer 130. Typically, spacer 130 comprises a material such as silicon dioxide ($SiO_2$), other oxide, silicon nitride ($Si_3N_4$ or SiN), other nitride or other insulator. The spacer insulating material is deposited in a sheet covering the surface of first insulator 120 and filling hole 122 completely to provide the base material for spacer 130. When hole 122 is filled, first interconnect 110 is covered by the insulating material.

Next, in step 432, spacer 130 is configured. Using an anisotropic etching process (e.g., anisotropic dry etching), spacer 130 is formed from the spacer insulating material to provide sublithographic hole 124. Because the spacer insulation layer is deposited above first insulator 120, the spacer insulator material also forms within and fills hole 122. Using anisotropic etching, spacer 130 remains after the etching has removed all but the insulator material at the inner wall of hole 122, leaving sublithographic hole 124 and exposing first interconnect 110. The etching process is timed such that the insulator deposited on the sidewalls of hole 122 remain as shown by spacer 130 (see FIG. 1).

In production, parameters such as etching time, angle, etc., may be adjusted such that the sidewalls forming spacer 130 are left when a path has been etched through to first interconnect 110. After etching, spacer 130 surrounds the inner sidewall of hole 122, allowing for the construction of a sublithographic feature (e.g., sublithographic hole 124) for a reduced-area first electrode 140.

Next, in step 440, conductive layer 220, from which first electrode 140 will be formed, is deposited (see FIG. 2). Conductive layer 220 is formed over first insulator 120, spacer 130 and the exposed portion of first interconnect 110. Conductive layer 220 lines sublithographic hole 124 and is selected to minimize alloying, reactions or other chemical interactions with phase-change layer 154. Conductive layer 220 preferably comprises carbon, carbon nitride, carbon nanotubes, etc. Typically a plasma-enhanced chemical vapor deposition (PECVD) process is used to deposit carbon. Alternatively, other methods may include chemical vapor deposition (CVD), metal-organic chemical vapor deposition (MOCVD), sputtering, physical vapor deposition (PVD), atomic layer deposition, selective deposition, or other deposition methods generally known in the art.

Next, in step 450, insulator layer 210 is deposited over conductive layer 220 (see FIG. 2). A portion of insulator layer 210 will form center insulator 150 after configuration. Insulator layer 210 is made of, for example, silicon dioxide ($SiO_2$) other oxide, silicon nitride ($Si_3N_4$ or $SiN_x$), other nitride or other insulator. Insulator layer 210 may be deposited by techniques such as chemical vapor deposition (CVD), metal-organic chemical vapor deposition (MOCVD), sputtering, physical vapor deposition (PVD), atomic layer deposition, selective deposition or other deposition methods generally known in the art.

Next, in step 452, insulator layer 210 is configured. Specifically, the portion of insulator layer positioned above conductive layer 220 is removed by, for example, a chemical mechanical polishing (CMP) process. A carbon-containing conductive layer 220 may function as a natural etch stop for the CMP process. Upon conclusion of the configuration step, center insulator 150 remains within sublithographic hole 124.

Next, in step 460, conductive layer 220 is configured to produce first electrode 140. Specifically, the portion of conductive layer 220 formed on first insulator 120 is removed. Removal may be accomplished, for example with an ashing process. Ashing entails removal of carbon (or carbon-containing materials) with a plasma. Plasmas containing oxygen or nitrogen are known in the art as effective media for ashing carbon and carbon-containing materials. It is also known in the art that ashing removes carbon or carbon-containing materials with high selectivity relative to high dielectric constant materials such as silicon dioxide. As a result, the ashing process preferentially removes the portion of conductive layer 220 formed over first insulator 120 without disturbing central insulator 150 or the portion of conductive layer 220 protected by central insulator 150. The net effect of the ashing process is to form exposed end portion 148 and exposed upper portion 146 of first electrode 144 (see FIG. 1). Note that exposed end portion 148 and exposed upper portion 146 protrude above first insulator 120. This structure enables contact of exposed end portion 148 and exposed upper portion 146 with subsequently deposited phase change layer 154. A step of wet chemical etching (which may include a chemical mechanical polishing (CMP) process) may also be performed after the ashing process if desired to remove residue that may remain.

Next, in step 470, central insulator 150 is optionally recessed to enlarge exposed upper portion 146. Central insulator 150 can be recessed by a chemical or reactive ion etch to expose a greater area of first electrode 140. By recessing central insulator 150, the upper portion of first electrode 140 protrudes as a rim-like structure or lip above first insulator 120. The area of contact between first electrode 140 and phase-change layer 154 can be varied by controlling the depth to which central insulator 150 is recessed.

Next, in step 480, phase-change layer 154 is provided. Typically, GST225 is deposited in a layer. Other phase-change materials may also be used as discussed above, including chalcogenide alloys. Phase-change layer 154 is provided as a substantially flat layer over the surfaces of first insulator 120, first contact region 144, and center insulator 150. At first contact region 144 there is an electrical communication with phase-change layer 154 at exposed end portion 148 and exposed upper portion 146. Optionally, after phase-change layer 154 is provided, a barrier layer may be deposited over phase-change layer 154 to protect the phase-change material from metal or atomic migration from upper contact 160. However, as discussed above, first electrode 140 is typically made of carbon, carbon nitride, carbon nanotubes, etc., that exhibit little or no tendency to react, alloy, or chemically interact with phase-change layer 154. Accordingly, a barrier layer may be omitted.

Next, in step 482, a layer of second insulator material is provided. Second insulator material may comprise a material such as silicon dioxide ($SiO_2$), other oxide, silicon nitride ($Si_3N_4$ or $SiN_x$), other nitride or other insulator.

Next, in step 486, second insulator material is configured to provide second insulater layer 170 using, in an example, reactive ion etching (RIE) or a chemical etch with appropriate masking techniques. Because second insulator material is provided as a layer that fully covers phase-change layer 154 in step 482, it is necessary to remove some of second insulator material so that second electrode 160 may contact phase-change layer 154. To achieve the configuration shown in FIG. 1, the perimeter portion of second insulator layer is removed (e.g. by masking the central portion of the second insulator layer and etching the perimeter portion) to leave behind second insulator layer 170. Where there is a concern for phase-change layer 154 being damaged by the formation of second insulator layer 170, an etch stop may be deposited after phase-change layer 154 (see step 480) and before the second insulator material is provided (see step 482). The etch-stop is conductive, which allows for second electrode 160 to electrically communicate with phase-change layer 154. An example of a conductive etch-stop is a thin layer of carbon.

Next, in step 490, second electrode 160 is provided. Second electrode 160 may be a metal, metal alloy, or metal-containing compound (e.g. W, Ti, TiAlN, TiSiN, TiN, MoN) or carbon and may be a homogeneous, layered, or composite material. To minimize alloying, reaction and/or chemical interactions between second electrode 160 and phase-change layer 154, it is desirable to form second electrode 160 from carbon, carbon nitride, carbon nanotubes or other carbon-containing material. Second electrode 160 may be formed using CVD, MOCVD, PECVD, sputtering, PVD, selective deposition, or other technique known in the art. When conformally deposited as a layer, the conductive material for second electrode 160 conforms over second insulator layer 170 and contacts phase-change layer 154 to form second contact region 162. The presence of second insulator layer 170 creates a lateral displacement of second contact region 162 relative to first contact region 144. The lateral displacement biases the direction of current flow during device operation away from the portion of phase-change layer 154 immediately above the central portion of sublithographic hole 124. As a result, the programmed region of phase-change layer 154 extending from first electrode 140 is directed radially away from the center of the device and is preferentially oriented toward the lateral portion of the device. This tends to inhibit or prevent the formation of a single, contiguous programmed region in the central portion of phase-change layer 154 extending across the interior of the enclosed cross-section defined by first electrode 140. Instead, as shown in FIG. 3, the programmed region is localized near the surface of first electrode 140 and extends in the direction away from the interior of the cross-section enclosed by first electrode 140.

Next, in step 492, second electrode 160 is configured. Second electrode 160 is provided as a layer in step 490 and may need to be configured by patterning, e.g., etching, to remove excess material in the vertical or lateral directions. The resulting patterned second electrode 160 forms an annular region adjacent to phase-change layer 154 that defines second contact region 162.

Next, in step 494, capping insulator 170' is provided (see FIG. 1C) to isolate memory device 100 electrically and thermally from other circuits or structures that may be constructed over memory device 100. Capping insulator 170' may be made of silicon dioxide ($SiO_2$), other oxide, silicon nitride ($Si_3N_4$ or $SiN_x$), other nitride, or other insulators, and may be deposited by techniques such as chemical vapor deposition (CVD), metal-organic chemical vapor deposition (MOCVD), sputtering, physical vapor deposition (PVD), atomic layer deposition, selective deposition, or other deposition methods generally known in the art.

Figure 5:
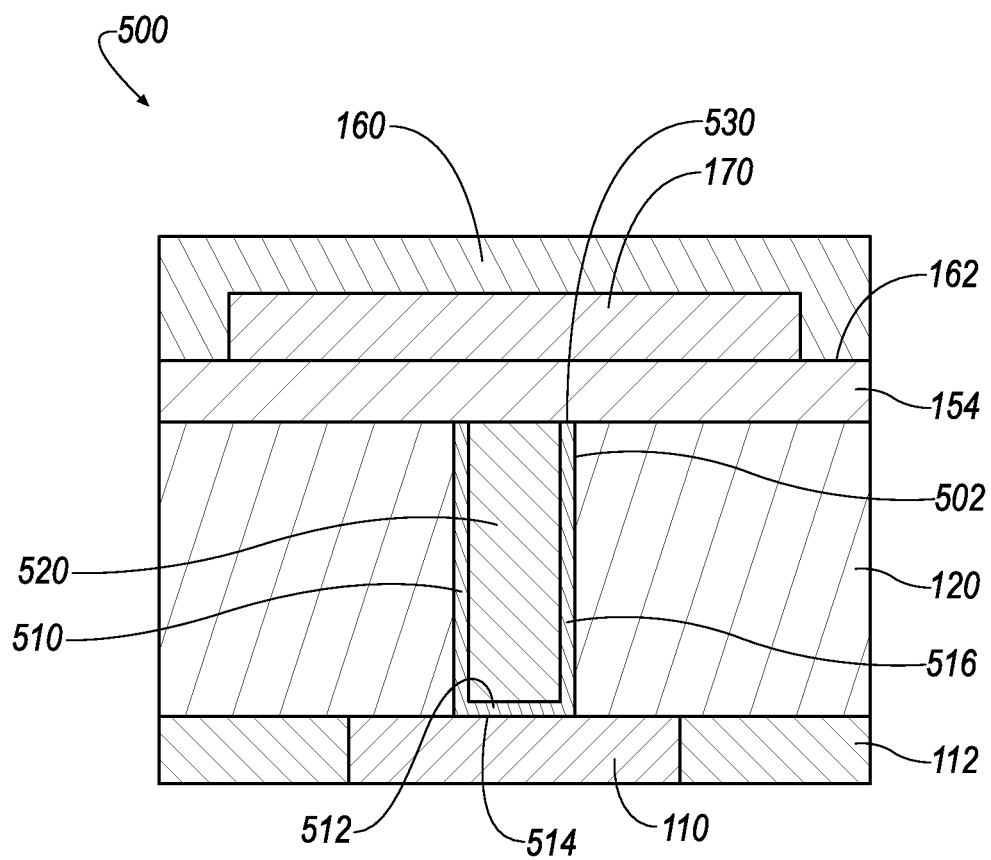
FIG. 5 is a cross-sectional view of an alternative phase-change memory device.

FIG. 5 is a cross-sectional view of an alternative phase-change memory device 500. As described herein, first interconnect 110, interconnect insulator 112, first insulator 120, phase-change layer 154, second insulator 170, and second electrode 160 are substantially the same as described above with respect to the embodiments of FIGS. 1-4. In general, phase-change memory device 500 is similar to the phase-change device 100 of FIG. 1. However, alternative phase-change memory device 500 does not include spacer 130 as shown in FIG. 1. Additionally, memory device 500 includes a cup structure 510 and a plug 520. Cup structure 510 includes a bottom portion 512 that has a lower interface 514 that is in electrical communication with first interconnect 110.

An alternative first contact region 530 is formed on the top end of a vertical portion 516 of cup structure 510. Lower interface 514 electrically communicates with first interconnect 110 and vertical portion 516 allows current flow through first contact region 530 to lower interface 514, and to first interconnect 110. In the alternative example shown as memory device 500, cup structure 510 is an electrode structure that carries electrical current between first interconnect 110 and phase-change layer 154. Moreover, cup structure 510 also allows for electrical communication between first interconnect 110, plug 520, and phase-change layer 154.

Cup structure 510 may comprise, for example, titanium nitride (TiN) and is deposited in a thin film. The titanium nitride (TiN) film may be deposited, for example, by physical vapor deposition (PVD). Plug 520 may comprise, for example, carbon, carbon nitride (CN), carbon nanotubes, etc. and is selected to minimize reactivity, alloying, or chemical interactions of plug 520 with phase-change layer 154. Typically, a plasma-enhanced chemical vapor deposition (PECVD) process is used to deposit carbon or a carbon-containing plug 520. However, other methods may also include chemical vapor deposition (CVD), metal-organic chemical vapor deposition (MOCVD), sputtering, physical vapor deposition (PVD), atomic layer deposition, selective deposition or other deposition methods generally known in the art.

In operation, phase-change layer 154 is written to and read from using electrical current. Current flow is from first interconnect 110, through cup structure 510, to first contact region 530. The current then flows through phase-change layer 154 (which serves as the non-volatile storage medium) and through second contact region 162 to second electrode 160.

A hole 502 is configured through first insulator 120 to expose first interconnect 110. A layer is then deposited that will define cup structure 510. A layer of material is then deposited that will define plug 520. Each of the layers will then be configured so that only cup structure 510 and plug 520 remain and their surfaces are coplanar with first insulator 120.

Figure 6:
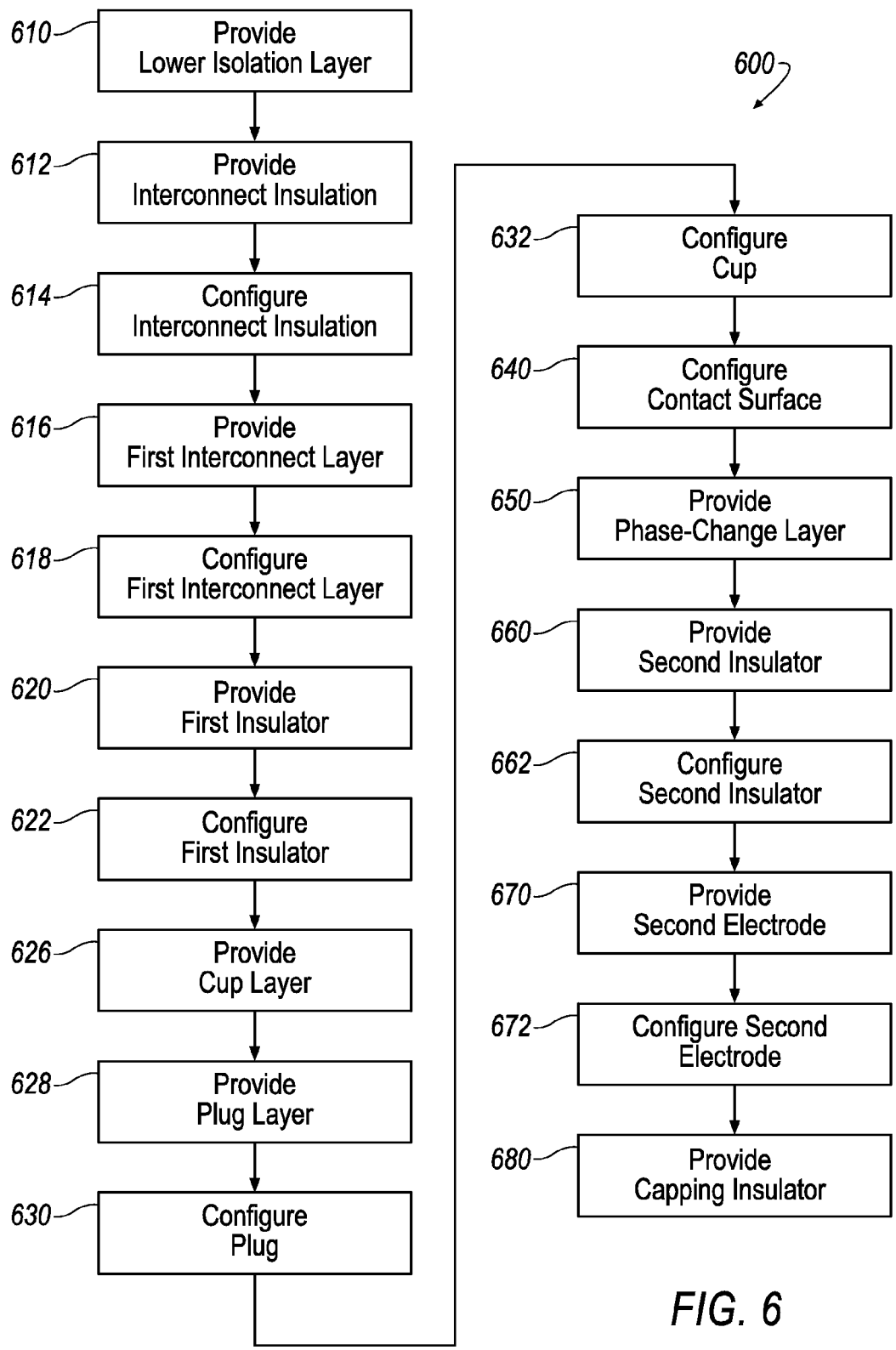
FIG. 6 is a flow diagram of the construction of the alternative phase-change memory device of FIG. 5.

FIG. 6 is a flow diagram 600 of the construction of the alternative phase-change memory device of FIG. 5. In step 610, a lower isolation layer is provided. The lower isolation layer may be made of silicon dioxide ($SiO_2$), other oxide, silicon nitride ($Si_3N_4$ or $SiN_x$), other nitride, or other insulator, and may be deposited by techniques such as chemical vapor deposition (CVD), metal-organic chemical vapor deposition (MOCVD), sputtering, physical vapor deposition (PVD), atomic layer deposition, selective deposition. The lower isolation layer generally provides electrical and thermal isolation from any structures that memory device 500 may be constructed on top of. Thermal isolation is provided so that device operating heat is not leaked to adjacent structures and remains concentrated on phase-change layer 154, thus minimizing the energy required during operation to create or maintain a particular level of heating within the phase-change layer. Further, the lower isolation layer may be provided on top of a wafer that includes semiconductor elements where memory device 500 is to be constructed above or within typical interconnect strata. That is to say, the lower isolation layer may be provided on top of a substrate that contains circuits and systems that are to be used in conjunction with memory device 500 or otherwise. Alternatively, the lower isolation layer may itself be a glass or silicon wafer of suitable properties for constructing memory device 500.

Next, in step 612, first interconnect insulator 112 is provided. First interconnect insulator 112 may comprise a material such as silicon dioxide ($SiO_2$), other oxide, silicon nitride ($Si_3N_4$ or $SiN_x$), other nitride or other insulator. Interconnect insulator 112 may be deposited by chemical vapor deposition (CVD), metal-organic chemical vapor deposition (MOCVD), sputtering, physical vapor deposition (PVD), atomic layer deposition, selective deposition or other deposition methods generally known in the art.

Next, in step 614, first interconnect insulator 112 is configured. First interconnect insulator 112 is provided as a layer in step 612 and is configured in step 614 by patterning (e.g., mask and etch) to form an opening for first interconnect 110.

Next, in step 616, first interconnect 110 is provided. First interconnect 110 is typically a conductive material, such as a metal, metal alloy, or metal-containing compound (e.g. W, Ti, TiAlN, TiSiN, TiN, MoN) or carbon and may be a homogeneous, layered, or composite material. First interconnect 110 may be deposited by chemical vapor deposition (CVD), metal-organic chemical vapor deposition (MOCVD), sputtering, physical vapor deposition (PVD), atomic layer deposition, selective deposition or other deposition methods generally known in the art. As memory device 100 may be constructed between steps in a semiconductor process, first interconnect 110 may be deposited along with other interconnect lines for other circuitry constructed on the substrate.

Next, in step 618, first interconnect 110 is configured. Excess material from the deposition of first interconnect 110 is removed. In particular, excess material that is above first interconnect insulator 112 is removed. In an example, the excess insulator material is removed using a chemical mechanical polishing (CMP) process.

Next, in step 620, first insulator 120 is provided. First insulator 120 may be a silicon dioxide ($SiO_2$), other oxide, silicon nitride ($Si_3N_4$ or $SiN_x$), other nitride or other insulator material and may be deposited by chemical vapor deposition (CVD), metal-organic chemical vapor deposition (MOCVD), sputtering, physical vapor deposition (PVD), atomic layer deposition, selective deposition or other deposition methods generally known in the art. For improved performance, first insulator 120 may be selected for reduced thermal conductivity to minimize heat losses away from phase-change layer 154 during programming operations. The alternative materials for first insulator 120 may include, but are not limited to, carbide materials, aerogel, xerogel and their derivatives.

Next, in step 622, first insulator 120 is configured to provide hole 502. In this step, hole 502 is etched through first insulator 120 to expose first interconnect 110 using, in an example, reactive ion etching (RIE) or a chemical etch with appropriate masking techniques. Because first insulator 120 was provided as a layer in step 620, it is necessary to remove some of the insulating material such that hole 502 is provided through the entire layer of first insulator 120. Typically, hole 502 is sized at the minimum lithographic dimension available.

Next, in step 626, a thin layer of conductive material is deposited that will form cup structure 510. Cup structure 510 the surrounding electrode may comprise a metal, metal alloy, or metal compound (e.g. Ti, TiN, TiAlN, MoN, W). Cup structure 510 may be deposited by chemical vapor deposition (CVD), metal-organic chemical vapor deposition (MOCVD), sputtering, physical vapor deposition (PVD), atomic layer deposition, selective deposition or other deposition methods generally known in the art. The layer conforms to the inner surface of hole 502 and also forms above first interconnect 110.

Next, in step 628, a layer is deposited that conforms to the thin layer deposited in step 626 and forms plug 520. Plug 520 may comprise carbon, carbon nitride, carbon nanotubes, or other carbon-containing compound that inhibits or prevents alloying, reacting or chemical interactions with phase-change layer 154. Typically a plasma-enhanced chemical vapor deposition (PECVD) process is used to deposit carbon. Other methods may also be used including chemical vapor deposition (CVD), metal-organic chemical vapor deposition (MOCVD), sputtering, physical vapor deposition (PVD), atomic layer deposition, selective deposition or other deposition methods generally known in the art. Plug 520 may fill cup structure 510 entirely.

Next, in step 630, plug 520 is configured and in step 632, cup structure 510 is configured. Various sequences of steps can be used. In one sequence, excess carbon or carbon-containing material used to form plug 520 is ashed as described herein above and the structure is subsequently processed using chemical mechanical polishing (CMP) remove excess portions of the material used to form cup structure 510 (e.g. the portion of the material used to form cup structure 510 formed on first insulator 120 is removed). In a second sequence, the material used to form cup structure 510 is removed by CMP, excess carbon or carbon-containing material used to form plug 520 is removed by ashing, and if desired, a further CMP processing step may be used to finalize the surface. If desired, a reactive ion etch (RIE) or chemical etch step with appropriate masking techniques may be used to expose the edge of cup structure 510 or plug 520 by recessing first insulator 120 as described hereinabove. In one embodiment, both cup layer 510 and first insulator 120 are recessed so that a lateral surface of plug 520 is exposed.

Next, in step 640, first contact region 530 is configured. In the first example, a chemical mechanical polishing (CMP) process is used to planarize the surface of first insulator 120, cup structure 510, and plug 520 as a prelude to deposition of phase-change layer 154. In embodiments in which first insulator 120 is recessed, carbon plug 520 and/or cup structure 510 protrudes above first insulator 120. Such protruding portions can be protected (e.g. masked) as first insulator 120 is planarized.

Next, in step 650, phase-change layer 154 is provided. Typically, GST225 is deposited in a layer. Other phase-change materials may also be used as discussed above, including chalcogenide alloys. Phase-change layer 154 is provided as a substantially flat layer over the surfaces of first insulator 120, first contact region 530, and plug 520. If first insulator 120 and/or cup structure 510 is recessed, phase-change layer 154 further contacts an exposed lateral portion of plug 520 or cup structure 510. At first contact region 530 there is an electrical communication with phase-change layer 154. Optionally, after phase-change layer 154 is provided, a barrier layer may be deposited over phase-change layer 154 to protect the phase-change material from metal or atomic migration from second electrode 160.

Next, in step 660, second insulator 170 is provided. Second insulator 170 may comprise a material such as silicon dioxide ($SiO_2$), other oxide, silicon nitride ($Si_3N_4$ or $SiN_x$), other nitride, or other insulator.

Next, in step 662, second insulator 170 is configured using, in an example, reactive ion etching (RIE) or a chemical etch with appropriate masking techniques. Because second insulator 170 was provided as a layer that fully covers phase-change layer 154 in step 682, it is necessary to remove some of the insulating material so that second electrode 160 may contact phase-change layer 154. Where there is a concern for phase-change layer 154 being damaged by the configuration of second insulator 170, an etch stop may be deposited after phase-change layer 154 (see step 680) and before second insulator 170 is provided (see step 682). The etch-stop is conductive, which allows for second electrode 160 to electrically communicate with phase-change layer 154. An example of a conductive etch-stop is a thin layer of carbon.

Next, in step 670, second electrode 160 is provided. Second electrode 160 may be a metal, metal alloy, or metal-containing compound (e.g. W, Ti, TiAlN, TiSiN, TiN, MoN) or carbon and may be a homogeneous, layered, or composite material. To minimize alloying, reaction and/or chemical interactions between second electrode 160 and phase-change layer 154, it is desirable to form second electrode 160 from carbon, carbon nitride, carbon nanotubes or other carbon-containing material. Second electrode 160 may be formed using CVD, MOCVD, PECVD, sputtering, PVD, selective deposition, or other technique known in the art. When conformally deposited as a layer, the conductive material for second electrode 160 conforms over second insulator 170 and contacts phase-change layer 154 to form second contact region 162.

Next, in step 672, second electrode 160 is configured. Second electrode 160 is provided as a layer and is configured by patterning, e.g., etching, to remove excess material. The resulting patterned second electrode 160 forms an annular region adjacent to phase-change layer 154 that defines second contact region 162.

Next, in step 680, capping insulator 170' is provided (see FIG. 1C) to isolate memory device 500 electrically and thermally from other circuits or structures that may be constructed over memory device 500. Capping insulator 170' may be made of silicon dioxide ($SiO_2$), other oxide, silicon nitride ($Si_3N_4$ or $SiN_x$), other nitride, or other insulators, and may be deposited by techniques such as chemical vapor deposition (CVD), metal-organic chemical vapor deposition (MOCVD), sputtering, physical vapor deposition (PVD), atomic layer deposition, selective deposition, or other deposition methods generally known in the art.

The present invention has been particularly shown and described with reference to the foregoing embodiments, which are merely illustrative of the best modes for carrying out the invention. It should be understood by those skilled in the art that various alternatives to the embodiments of the invention described herein may be employed in practicing the invention without departing from the spirit and scope of the invention as defined in the following claims. The embodiments should be understood to include all novel and non-obvious combinations of elements described herein, and claims may be presented in this or a later application to any novel and non-obvious combination of these elements. Moreover, the foregoing embodiments are illustrative, and no single feature or element is essential to all possible combinations that may be claimed in this or a later application.

With regard to the processes, methods, heuristics, etc. described herein, it should be understood that although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes described herein are provided for illustrating certain embodiments and should in no way be construed to limit the claimed invention.

Accordingly, it is to be understood that the above description is intended to be illustrative and not restrictive. Many embodiments and applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

All terms used in the claims are intended to be given their broadest reasonable constructions and their ordinary meanings as understood by those skilled in the art unless an explicit indication to the contrary is made herein. In particular, use of the singular articles such as "a," "the," "said," etc. should be read to recite one or more of the indicated elements unless a claim recites an explicit limitation to the contrary.

We claim:

1. A method of making a memory device comprising:
   providing a first insulator;
   configuring a hole through said first insulator;
   providing a first conductive layer that conforms to the inner periphery of said hole;
   configuring a portion of said first conductive layer to provide a first electrode, said first electrode being conformal to said periphery of said hole;
   providing a phase-change material over said first insulator and in electrical communication with said first electrode, said phase-change material having a lower surface, said lower surface including a radially-inwardly facing surface portion and an arcuate-shaped, downwardly-facing portion;
   providing a second insulator over said phase-change material and said hole;
   removing a portion of said second insulator to expose a portion of said phase-change material, said exposed portion of said phase-change material being laterally displaced from said inner periphery of said hole; and
   providing a second conductive layer over said exposed portion of said phase-change material, said second conductive layer being in electrical communication with said phase-change layer.

2. The method of claim 1, further comprising:
   providing a third insulator, said third insulator conforming to the portion of said first conductive layer that conforms to said periphery of said hole, said phase-change material being formed over said third insulator.

3. The method of claim 2, further comprising:
   recessing said third insulator to a depth below the top surface of said first insulator.

4. The method of claim 3, wherein said phase-change material directly contacts said recessed portion of said third insulator.

5. The method of claim 1, said further comprising:
   providing and configuring a spacer within said hole to achieve a sublithographic opening through said first insulator.

6. The method of claim 1, wherein said providing first conductive layer includes providing carbon.

7. The method of claim 6, wherein said providing first conductive layer further comprises providing nitrogen.

8. The method of claim 1, wherein said phase change material is provided in direct contact with said first electrode, said direct contact occurring at a contact region.

9. The method of claim 8, wherein said first electrode includes an upper surface in direct contact with said lower surface of said phase change material at said contact region, said upper surface of said first electrode including an arcuate-shaped, upwardly-facing surface portion, said arcuate-shaped, upwardly-facing surface portion of said first electrode directly contacting said arcuate-shaped, downwardly-facing portion of said lower surface of said phase-change material.

10. The method of claim 9, wherein said upper surface of said first electrode terminates at an outwardly-facing end surface, said outwardly-facing end surface directly contacting said phase change material.

11. The method of claim 1, wherein said providing the second conductive layer includes:
    arranging said second conductive layer over said second insulator, said second conductive layer including a first portion in direct contact with said second insulator, and
    extending said second conductive layer along a thickness of said second insulator to form a second portion of said second conductive layer, said second portion of said second conductive layer directly contacting said exposed portion of said phase change material.

* * * * *